(12) United States Patent
Alzaher

(10) Patent No.: US 10,141,964 B1
(45) Date of Patent: Nov. 27, 2018

(54) LOW-POWER CHANNEL SELECT FILTER USING TRANSRESISTANCE AMPLIFIER FOR DVB-H RECEIVERS

(71) Applicant: King Fahd University of Petroleum and Minerals, Dhahran (SA)

(72) Inventor: Hussain Alzaher, Dhahran (SA)

(73) Assignee: King Fahd University of Petroleum and Minerals, Dhahran (SA)

(*) Notice: Subject to any disclaimer, the term of this patent is extended or adjusted under 35 U.S.C. 154(b) by 0 days.

(21) Appl. No.: 15/905,190

(22) Filed: Feb. 26, 2018

Related U.S. Application Data

(60) Provisional application No. 62/566,811, filed on Oct. 2, 2017.

(51) Int. Cl.
*H03F 3/45* (2006.01)
*H04B 1/16* (2006.01)
*H03F 1/02* (2006.01)

(52) U.S. Cl.
CPC ............. *H04B 1/16* (2013.01); *H03F 1/0205* (2013.01); *H03F 3/45179* (2013.01); *H03F 3/45636* (2013.01); *H03F 2200/222* (2013.01); *H03F 2200/267* (2013.01); *H03F 2200/63* (2013.01); *H03F 2203/45022* (2013.01); *H03F 2203/45051* (2013.01); *H03F 2203/45116* (2013.01); *H03F 2203/45151* (2013.01); *H03F 2203/45156* (2013.01); *H03F 2203/45202* (2013.01)

(58) Field of Classification Search
CPC ..... H04B 1/16; H03F 1/0205; H03F 3/45179; H03F 3/45636; H03F 2203/45051; H03F 2203/45156; H03F 2203/45116; H03F 2203/45022; H03F 2203/45151; H03F 2203/45202; H03F 2200/63; H03F 2200/222; H03F 2200/267
USPC ........................................................ 375/316
See application file for complete search history.

(56) References Cited

U.S. PATENT DOCUMENTS

| 4,661,978 A * | 4/1987 | Hirata ...................... H03F 1/48 330/151 |
| 9,455,668 B1 * | 9/2016 | Garbarino ............. H03F 1/0205 |

(Continued)

OTHER PUBLICATIONS

Realizations of CMOS Fully Differential Current Followers/Amplifier by Hussain Alzaher and Noman Tasadduq, dated 2009.*

(Continued)

*Primary Examiner* — Siu Lee
(74) *Attorney, Agent, or Firm* — Oblon, McClelland, Maier & Neustadt, L.L.P.

(57) ABSTRACT

A CMOS channel select filter for DVB-H direct-conversion receives based on a transresistance amplifier (TRA) is disclosed. The channel select filter includes a fully differential transresistance amplifier (FDTRA) configured to change an input current at each differential input terminal to a voltage at each differential output terminal based on an impedance at a corresponding differential impedance terminal. The channel select filter also includes two feedback resistors, each having one end connected to a respective differential output terminal of the FDTRA and having another end connected to the node, two first capacitors, each connected between ground and the node, and two second capacitors, each connected between ground and a respective differential impedance terminal.

12 Claims, 5 Drawing Sheets

(56) References Cited

U.S. PATENT DOCUMENTS

| | | | |
|---|---|---|---|
| 9,564,874 B1 * | 2/2017 | Alzaher | ............ H03H 11/1256 |
| 2015/0031320 A1 | 1/2015 | Li et al. | |
| 2017/0005633 A1 | 1/2017 | Gorecki et al. | |
| 2017/0141810 A1 | 5/2017 | Nguyen et al. | |

OTHER PUBLICATIONS

Hussain Alzaher, et al., "Low-Power Channel Select Filters for DVB-H Receivers", IEEE Transactions on Circuits and Systems II: Express Briefs, vol. 64, Issue 8, Oct. 4, 2016, pp. 902-906.

Raghavendra Kulkarni, et al., "A Broadband 470-862 MHz Direct Conversion CMOS Receiver", IEEE, May 2010, pp. 2227-2230.

* cited by examiner

LOW-POWER CHANNEL SELECT FILTER USING TRANSRESISTANCE AMPLIFIER FOR DVB-H RECEIVERS

STATEMENT REGARDING PRIOR DISCLOSURES BY THE INVENTOR OR A JOINT INVENTOR

Alzaher et al., Low-Power Channel Select Filters for DVB-H Receivers. IEEE Transactions on Circuits and Systems II: Express Briefs, Volume: 64, Issue: 8, Oct. 4, 2016, Pages 902-906, which is incorporated herein by reference in its entirety.

TECHNICAL FIELD

The present application is directed to a channel select filter for receivers implementing the Digital Video Broadcasting-Handheld (DVB-H) standard, which is incorporated herein by reference. The channel select filter includes a fully differential transresistance amplifier (FDTRA) as a basic building block to fulfill the selectivity requirements of the DVB-H standard and to improve power consumption.

BACKGROUND

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

In general, DVB-H systems can be found in three different types of integrated mobile TV tuners: (a) Direct conversion for DVB-H, (b) Direct conversion for multi-standard reception, and (c) Mixed direct conversion and low-IF (low intermediate frequency) for multi-standard reception. It is advantageous for a multi-standard reception mobile TV tuner to adopt direct conversion structure for DVB-H reception and low-IF structure for the Sistema Brasileiro de Televisão Digital (ISDB-T) and terrestrial digital multimedia broadcasting (T-DMB) standards, as DVB-H is wide band and ISDB-T & T-DMB are narrow band systems.

However, it is not power-efficient to reconfigure a complex band-pass filter used in the low-IF mode to act as a low-pass filter for DVB-H direct conversion mode. This is because the active complex band-pass filters used in the low-IF mode require at least two active components (i.e., amplifiers) per biquadratic filter (hereinafter, "biquad") for each path of the filter, whereas the low-pass filter for DVB-H may be realized by biquad low-pass filters utilizing a single active component per biquad. A biquad is a second order filter having two poles and two zeros.

Also, the significantly distinct bandwidths of the various standards hinder improving the same filter for the two modes. Two different filters may be used: one for the low-IF mode and one for the DVB-H direct conversion mode, wherein the unused filter goes into a power saving mode. While a dual-filter system would be achieved at the cost of area, a significant part of the area is often occupied by capacitors, which may be shared between the two filters, thereby significantly reducing the overall area of the system.

For filters that are part of a DVB-H receiver or a multi-standard mobile TV integrated direct-conversion receiver, demanding constraints are placed on the filter's linearity and power consumption.

The present disclosure is directed to a low power low-pass filter based on a transresistance amplifier (TRA) providing significant power saving compared with the available solutions. An FDTRA is a fully differential current-to-voltage converter, whose gain is set based on the conversion resistance. FDTRAs are associated with voltage buffered outputs that can drive large capacitive loads without slewing.

SUMMARY

The foregoing paragraphs have been provided by way of general introduction, and are not intended to limit the scope of the following claims. The described embodiments, together with further advantages, will be best understood by reference to the following detailed description taken in conjunction with the accompanying drawings.

In one embodiment, there is provided a channel select filter including a fully differential transresistance amplifier (FDTRA) to change an input current at each differential input terminal to a voltage at each differential output terminal based on an impedance at a corresponding differential impedance terminal and including two first resistors, each having one end connected to a respective differential input terminal of the FDTRA and having another end connected to a node. The channel select filter also includes two feedback resistors, each having one end connected to a respective differential output terminal of the FDTRA and having another end connected to the node, two first capacitors, each connected between ground and the node, and two second capacitors, each connected between ground and a respective differential impedance terminal.

In another embodiment, the channel select filter is included in a Digital Video Broadcasting—Handheld (DVB-H) or a multi-standard mobile receiver. In yet another embodiment, the FDTRA includes two current amplifiers, each including one of the differential input terminals, and two voltage buffers, each including one of the differential output terminals. Each current amplifier includes two complementary outputs, input stage transistors providing a DC virtual ground, and a class-AB output stage, in another embodiment.

In another embodiment, an input to each of the voltage buffers is based on a differential between different complementary outputs of different current amplifiers.

In another embodiment, the channel select filter includes three cascading sections, each section including exactly one FDTRA, two feedback resistors, and two first resistors. The second and third cascading sections may have an FDTRA employing current amplifiers with differential gain of 25 and the first cascading section may have an FDTRA employing current amplifiers with a differential gain of 1.

In another embodiment, the channel select filter includes two second resistors, each connected in series with a respective one of the feedback resistors and in series with a respective one of the first resistors. The channel select filter may include two first capacitors, each connected between ground and a point between each respective pair of a first resistor and a second resistor. The resistance of the feedback resistors may be equal to two times the resistance of the second resistors, in an embodiment.

In another embodiment, a video receiver includes a channel select filter including three cascading section, each section including exactly one fully differential transresistance amplifier (FDTRA) configured to change an input current at each differential input terminal to a voltage at each differential output terminal based on an impedance at a corresponding differential impedance terminal. The video receiver further including two first resistors, each having one end connected to a respective differential input terminal of the FDTRA and having another end connected to a node and two feedback resistors, each having one end connected to a respective differential output terminal of the FDTRA and having another end connected to the node. The video receiver also includes two first capacitors, each connected between ground and the node and two second capacitors, each connected between ground and a respective differential impedance terminal.

In one embodiment, the FDTRA includes two current amplifiers, each including one of the differential input terminals, and two voltage buffers, each including one of the differential output terminals. Each current amplifier may include two complementary outputs, input stage transistors providing a DC virtual ground, and a class-AB output stage. An input to each of the voltage buffers may be based on a differential between different complementary outputs of different current amplifiers.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION

Figure 1:
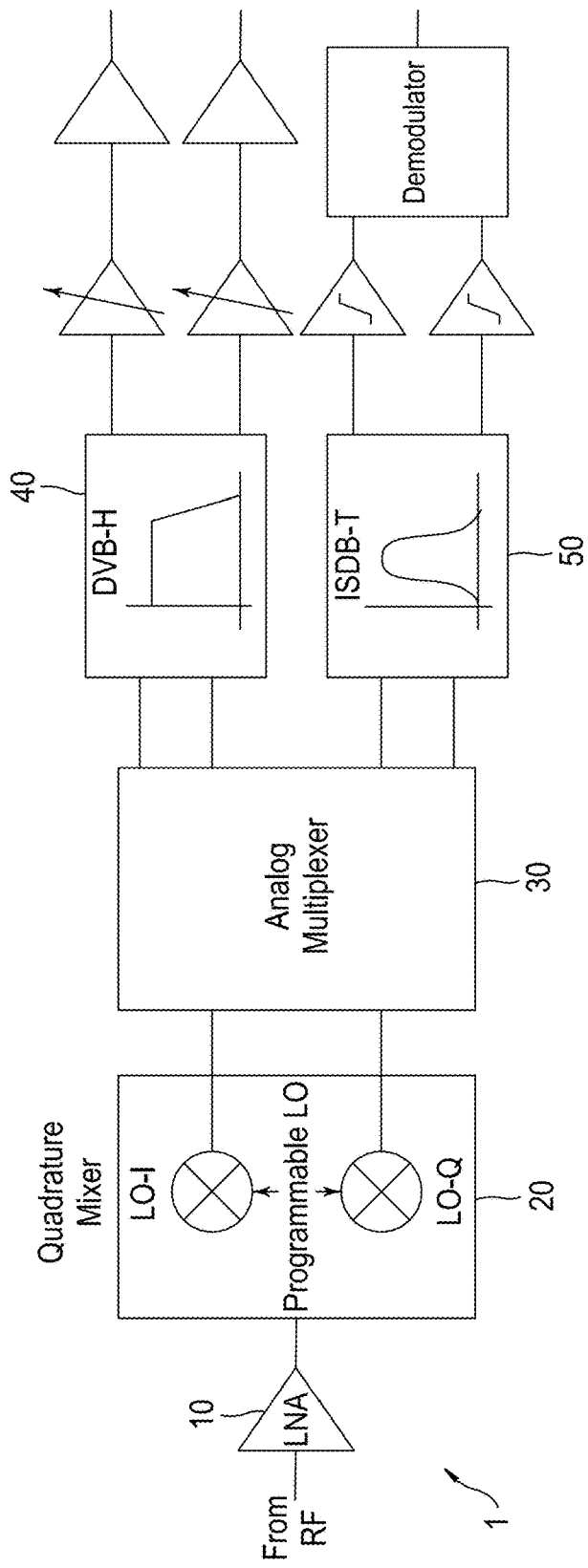
FIG. 1 shows an embodiment in which the disclosed filter is included in a multi-standard mobile TV integrated receiver.

In the drawings, like reference numerals designate identical or corresponding parts throughout the several views. Further, as used herein, the words "a," "an" and the like generally carry a meaning of "one or more," unless stated otherwise. The drawings are generally drawn to scale unless specified otherwise or illustrating schematic structures or flowcharts.

Furthermore, the terms "approximately," "about," and similar terms generally refer to ranges that include the identified value within a margin of 20%, 10%, or preferably 5%, and any values therebetween.

Several designs of channel select filters for DVB-H systems are known. The known solutions incorporate low-pass filters and are categorized based on the employed receiver architecture into the following categories: direct conversion for DVB-H reception; direct conversion for multi-standard reception; and direct conversion and low-IF for multi-standard reception.

The following description is of tuners for DVB-H direct conversion receivers. For example, a tuner that uses an $8^{th}$-order inverse Chebyshev low-pass filter is proposed in P. Antoine P. Bauser, H. Beaulaton, M. Buchholz, D. Carey, T. Cassagnes, T. K. Chan, S. Colomines, F. Hurley, D. T. Jobling, N. Kearney, A. C. Murphy, J. Rock, D. Salle, and C. Tu, "A direct-conversion receiver for DVB-H," *IEEE J. Solid-State Circuits*, vol. 40, no. 12, pp. 2536-2546, December 2005—incorporated herein by reference. In the above-noted proposal, the $8^{th}$-order characteristic is achieved by using four Tow-Thomas biquad sections.

A low noise low-pass filter for DVB-H utilizing two sections is proposed by A. Tekin, H. Elwan, A. Ismail, and K. Pedrotti, "Noise-shaping gain-filtering techniques for integrated receivers," *IEEE J. Solid-State Circuits*, vol. 44, no. 10, pp. 2689-2701, October 2009—incorporated herein by reference. The first of the two sections employs a frequency dependent negative resistance (FDNR) based 3rd-order pre-filter while the second section uses an instrumentation amplifier based gain filtering stage with asymmetric floating FDNR.

Also, a $7^{th}$-order low-pass Chebyshev active-RC filter is suggested in Y. Zhou, W. Guangjun, and F. Xiao, "A 2.5-V 56-mW baseband chain in a multistandard TV tuner for mobile and multimedia applications," *J. of Semicond.*, vol. 32, no. 2, pp. 035003-1 to 035003-6, March 2011—incorporated herein by reference. In this system, capacitor arrays are used to tune the cutoff frequencies to 1.8/2.5/3/3.5/4 MHz.

In addition, DVB-H tuners that cover both UHF and L bands are implemented in the following proposals. Dual $6^{th}$-order type-I Chebyshev low-pass filters are used in I. Vassiliou, K. Vavelidis, S. Bouras, S. Kavadias, Y. Kokolakis, G. Kamoulakos, A. Kyranas, C. Kapnistis, and N. Haralabidis, "A 0.18 μm CMOS dual-band direct-conversion DVB-H receiver," in *IEEE Int. Solid-State Circuits Conf. (ISSCC) Dig. Tech. Papers*, February 2006, pp. 606-607—incorporated herein by reference. The filters in this proposal are designed using active-RC technique with a leapfrog configuration.

Two $1^{st}$-order RC filters followed by three sections of active-RC biquads to realize an $8^{th}$-order response are used in the proposal of Y. Kim, J. Kim, V. N. Parkhomenko, D. Baek, J. Lee, E. Sung, I. Nam, and B. Park, "A multi-band multi-mode CMOS conversion DVB-H tuner," in *IEEE Int. Solid-State Circuits Conf. (ISSCC) Dig. Tech. Papers*, February 2006, pp. 608-609—incorporated herein by reference.

On the other hand, a $7^{th}$-order type-II Chebyshev filter is used in M. Womac, A. Deiss, T. Davis, R. Spencer, B. Abesingha, and P. Hisayasu, "Dual-band single-ended-input direct-conversion DVB-H receiver," in *IEEE Int. Solid-State Circuits Conf. (ISSCC) Dig. Tech. Papers*, February 2006, pp. 610-611—incorporated herein by reference. This system employs a three-operational-amplifier biquad implementation.

DVB-T/H tuners can also be used for a direct conversion receiver. A low-pass $5^{th}$-order Legendre filter is implemented using OTA-RC in S. Amiot, G. Bassement, A. Daubenfeld, V. Fillatre, E. Maurice, F. Mercier, T. Mevel, Y. Richard, and J. Tourret, "A low power DVB-T/H Zero-IF tuner IC design in 0.25 μm BiCMOS technology for mobile TV reception," *IEEE Transactions on Broadcasting*, vol. 53, no. 1, pp. 434-440, March 2007—incorporated herein by reference. A $6^{th}$-order Chebyshev filter is implemented in C. Lujan-Martinez, R. G. Carvajal, A. Torralba, A. Lopez-Martin, J. Ramirez-Angulo, and U. Alvarado, "Low-power baseband filter for zero-intermediate frequency digital video broadcasting terrestrial/handheld receivers," *IET Circuits, Devices Syst.*, vol. 3, no. 5, pp. 291-301, October 2009—incorporated herein by reference. In this system, an RLC ladder structure is selected to design the $6^{th}$-order filter wherein four cross coupled transconductors and two capacitors used to realize each floating inductor. Since the filter structure requires compensation for the transfer function loss, an active-RC preamplifier and a gm-C based post-amplifier are incorporated in the system as well.

A direct conversion multi-standard TV tuner that is capable of working with DVB-T, DVB-H, T-DMB and ISDB-T can be used: I. Vassiliou, K. Vavelidis, N. Haralabidis, A. Kyranas, Y. Kokolakis, S. Bouras, G. Kamoulakos, C. Kapnistis, S. Kavadias, N. Kanakaris, E. Metaxakis, C. Kokozidis, and H. Peyravi, "A 65 nm CMOS multistandard, multiband TV Tuner for mobile and multimedia applications," *IEEE J. Solid-State Circuits*, vol. 43, no. 7, pp. 1522-1533, July 2008—incorporated herein by reference, and K. Vavelidis, I. Vassiliou, N. Haralabidis, A. Kyranas, Y. Kokolakis, S. Bouras, G. Kamoulakos, C. Kapnistis, S. Kavadias, N. Kanakaris, E. Metaxakis, C. Kokozidis, and H. Peyravi, "A 65 nm CMOS multi-standard, multi-band mobile TV Tuner," in *Proc. IEEE Eur. Solid-State Circuits Conf.*, September 2007, pp. 424-427—incorporated herein by reference. In these proposals, active-RC $6^{th}$-order Chebyshev low-pass filters are used in leapfrog configuration with switched passive components. The filter corner frequency is programmable from 100 kHz to 7 MHz.

Another multi-standard direct conversion mobile video receiver is presented in K. Barnett, H. Muthali, S. Sengupta, Y. Feng, B. Yang, Z. Xiong, T. Kim, J. Jaffee, and C. Conroy, "A multi-standard mobile digital video receiver in 0.18 μm CMOS process," in *Proc. IEEE Eur. Solid-State Circuits Conf.*, September 2008, pp. 154-157—incorporated herein by reference. This system supports MediaFLO, DVB-H and ISDB-T standards, with a $7^{th}$-order Chebyshev low-pass filter realized using active-RC Tow-Thomas biquad structure. Resistor and capacitor arrays allow 5/6/7/8 MHz channel bandwidth tuning.

An $8^{th}$ order active-RC filter employing topology is adopted in L. Chen, Long Chen, Yixiao Wang, Chuan Wang, Jiayi Wang, Congyin Shi, Xuankai Weng, Le Ye, Junhua Liu, Huailin Liao, Yangyuan Wang "A 4.2 mm² 72 mW multi-standard direct-conversion DTV tuner in 65 nm CMOS," *IEEE Trans. Circuits Syst. I, Reg. Papers*, vol. 61, no. 1, pp. 280-292, January 2014—incorporated herein by reference. The bandwidth of the filter of this system can be changed over 0.5-4 MHz range.

A highly reconfigurable analog baseband for multi-standard wireless receivers including the DVB-H is presented in Y. Wang, L. Ye, H. Liao, R. Huang, and Y. Wang, "Highly reconfigurable analog baseband for multistandard wireless receivers in 65-nm CMOS," *IEEE Trans. Circuits Syst. II, Express Brief*, vol. 62, no. 3, pp. 296-300, March 2015—incorporated herein by reference. An $8^{th}$-order active-RC filter with a programmable bandwidth and gain is employed in this system. Its power consumption (1.72-9.6 mW) is proportional to its bandwidth (02 MHz to 20 MHz).

A $5^{th}$-order elliptic filter for channel selection of a DVB-H/T receiver was proposed in M. Notten, H. Brekelmans, and V. Rambeau, "A $5^{th}$-order 14 mWatt active polyphase filter for analog and digital TV on Mobile applications," in *Proc. IEEE Eur. Solid-State Circuits Conf.*, September 2006, pp. 211-214—incorporated herein by reference. This filter has a reconfigurable low-IF or direct conversion output for an analog and a DVB-H/T receiver, respectively. The active RC poly-phase filter works as a bandpass filter with a bandwidth of 8 MHz and center frequency of 5 MHz in low-IF mode. Additionally, the filter functions as a low-pass filter in direct conversion mode with a cutoff frequency of 4 MHz. The low-pass filter for the DVB-H/T receiver consumes 14 mW from a 2.7 V supply voltage. The filter exhibits an in-band input referred third-order intercept point (IIP3) of 23 dBm and passband ripples of 1.3 dB.

Other multi-standard tuners are presented next. The filter in J. Chang, H. Kim, J. Choi, H. Chung, J. Heo, S. Kang, J. Bae, H. Oh, Y. Kim, T. Kwon, R. Kim, W. Choo, D. Rhee, and B. Park, "A Multistandard Multiband Mobile TV RF SoC in 65 nm CMOS," in *IEEE Int. Solid-State Circuits Conf. (ISSCC) Dig. Tech. Papers*, February 2010, pp. 462-463 (incorporated herein by reference) is configured for dual mode operation, low-pass operation for DVB-H/T direct conversion and complex bandpass operation for ISDB-T and TDMB low-IF.

A similar multistandard (DVB-H/T, ISDB-T) with GSM interoperability is presented in H. Kim, S. Kang, J. Chang, J. Choi, H. Chung, J. Heo, J. Bae, W. Choo, and B. Park, "A Multi-standard Multi-band Tuner for Mobile TV SoC with GSM Interoperability," in *IEEE Radio Frequency Integ. Circuits Sym. (RFIC 2010)*, May 2010, pp. 189-192—incorporated herein by reference. It uses the filter of described in the above-cited paper by J. Chang et al., which is an active-RC $7^{th}$-order Chebyshev ladder type filter.

One more such tuner is presented in I. Nam, J.-D. Bae, H. Moon, and B.-H. Park, "A 85-mW Multistandard Multiband CMOS Mobile TV Tuner for DVB-H/T, T-DMB, and ISDB-T Applications with FM Reception," J. of Semiconductors Technology and Science, vol. 15, no. 3, pp. 381-389, June 2015—incorporated herein by reference. This tuner incorporates a $6^{th}$-order Chebyshev filter implemented using active RC leapfrog type filters. The filter employs two operational amplifiers per biquad.

However, a detailed performance characteristic of the channel select filters has not been provided. Different filter orders and approximation types are reported. However, DVB-H specifications state that the filter must have a passband of 3.8 MHz and attenuate blockers one and two at 5.12 MHz and 13.25 MHz by 25 dB and 70 dB, respectively. The adjacent channel rejection requirements of DVB-H are very stringent and therefore the Chebyshev filter is suitable, as it provides a lower filter order than a Butterworth filter, and simpler circuit realizations compared with Inverse Chebyshev filter and elliptic filter counterparts. Using Chebyshev approximation with a maximum of 0.5 dB ripple, it can be shown that a minimum of $6^{th}$-order function is needed to meet the DVB-H requirements.

As noted above, the present disclosure is directed to a low power low-pass filter based on a transresistance amplifier (TRA) providing significant power saving compared with the available solutions. Specifically, the present application is directed to a channel select filter to be included as part of a DVB-H receiver or a multi-standard mobile TV integrated direct-conversion receiver. FIG. 1 shows an embodiment in which the filter is included in a multi-standard mobile TV integrated receiver (1).

A signal received from a radio frequency (RF) receiver is input into a low noise amplifier (10), which amplifies the received signal without significantly degrading the signal-to-noise ratio (SNR). The output of the low noise amplifier (10) is then input into a quadrature mixer (20) that down-converts the incoming signal using a programmable local oscillator (LO) into an in-phase and an in-quadrature output.

The output of the quadrature mixer (20) is input into an analog multiplexer (30), which selects whether to process the signal according to the DVB-H standard or the ISDB-T standard. It is noted that the present application is not limited to this architecture, as other standards and filter architectures may be implemented in the multi-standard mobile TV receiver (1). For example, the analog multiplexer (30) may select from among more than two filtering options, corresponding to more than two reception standards. Alternatively, the embodiment may be a direct conversion DVB-H receiver that does not support multi-standard reception. In this embodiment, the analog multiplexer (30) is unnecessary and the signal is received in the channel select filter directly from the output of the quadrature mixer.

Returning to the embodiment of FIG. 1, the analog multiplexer outputs the signal either to a DVB-H channel select filter (40) or to an ISDB-T filter (50). Subsequent to the DVB-H channel select filter (40) or to an ISDB-T filter (50), the signal undergoes processing specific to the respective receiving standard. The present disclosure includes the structure of the DVB-H channel select filter (40).

As far as the structure of the DVB-H channel select filter (40), cascading of biquads employing a single active component, such as an amplifier, minimizes the number of amplifiers, thereby achieving lower power consumption and possibly less area. Also, such filter topologies are expected to exhibit better noise and linearity performances. Since the targeted application (DVB-H) is a wide band standard, using active-RC filters in this application would be associated with relatively high power consumption. Meanwhile, the filter linearity is considered to be the dominant factor in the overall linearity of the receiver system. Therefore, gm-C filters often having limited linearity particularly at low supply voltage are also not optimal, as described in Y. Tsividis, "Integrated continuous-time filter design-An overview," *IEEE J. Solid-State Circuits*, vol. 29, pp. 166-176, March 1994—incorporated herein by reference.

Therefore, a channel select filter using another amplifier type, namely the TRA, is described herein as a low-power filter having an acceptable linearity to meet the DVB-H standard requirements. The TRA amplifies an input current applied at low input terminal (X) and changes it to a voltage available at the output terminal ($V_o$) depending on the impedance connected at terminal (Z). Unlike its current amplifier counterpart, the TRA is adopted because it is associated with a voltage buffered output that can drive large capacitive loads without slewing. The ideal terminal characteristics of a TRA can be described with $I_Z = I_X$, $V_X = 0$, and $V_O = V_Z$. For a fully differential TRA (FDTRA), the same relations apply but with differential signals. A single cascading section (40A) of the channel select filter (40) is described with respect to FIG. 2.

Figure 2:
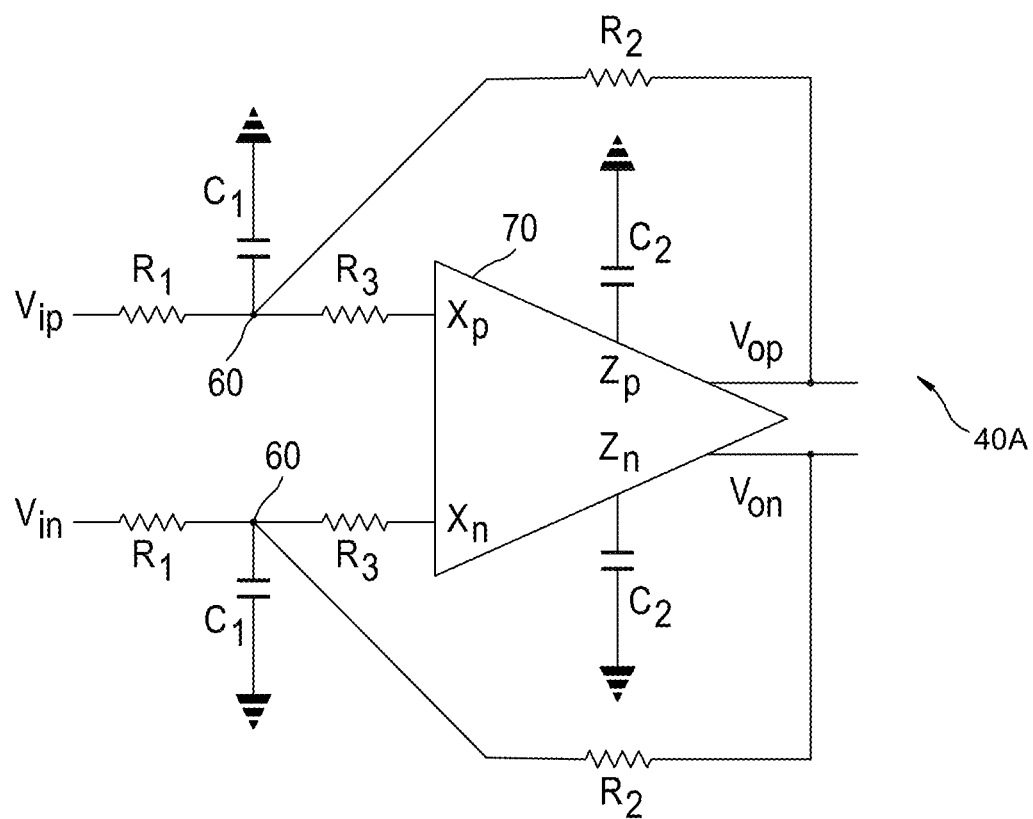
FIG. 2 shows one of the cascading sections of the disclosed channel select biquad filter based on a single FDTRA.

One cascading section (40A) of the channel select filter (40) of FIG. 2 receives a differential input signal $V_{in}$ and $V_{ip}$, which passes in each differential path through a resistor $R_1$. The resistor $R_1$ is connected, in each differential path, between the input and a node (60) to which a capacitor $C_1$ is connected, the other end of the capacitor $C_1$ being connected to ground. Another resistor $R_3$ is connected, in each differential path, between the node (60) and a differential input X of the FDTRA (70).

The FDTRA (70) has differential impedance terminals Z, each of which is connected to a capacitor $C_2$, the other end of which is connected to ground. The differential output terminals $V_o$ of the FDTRA (70) are connected respectively to a resistor $R_2$, the other end of which is connected to the node (60).

The transfer function of one cascading section (40A) of the channel select filter (40) shown in FIG. 2 can be written as follows:

$$\frac{V_{op} - V_{on}}{V_{ip} - V_{in}} = \frac{1/(C_1 C_2 R_1 R_3)}{s^2 + s(R_1 R_2 + R_2 R_3 + R_1 R_3)/(C_2 R_1 R_2 R_3) + 1/(C_1 C_2 R_2 R_3)} \quad (1)$$

In the transfer function of Equation (1), $V_{op}$ and $V_{on}$ are the differential outputs of one cascading section (40A) of the channel select filter (40), while $V_{ip}$ and $V_{in}$ are the differential inputs of the cascading section (40A) of the channel select filter (40). In one embodiment, s represents a frequency variable in the transfer function of Equation (1). The various R and C values in the transfer function of Equation (1) refer to the resistance or capacitance values of the respective resistor or capacitor.

However, the present disclosure is not limited to the filter configuration shown in FIG. 2 and other configurations of the resistors and capacitors can be selected based on a desired transfer function of the channel select filter.

Figure 3A:
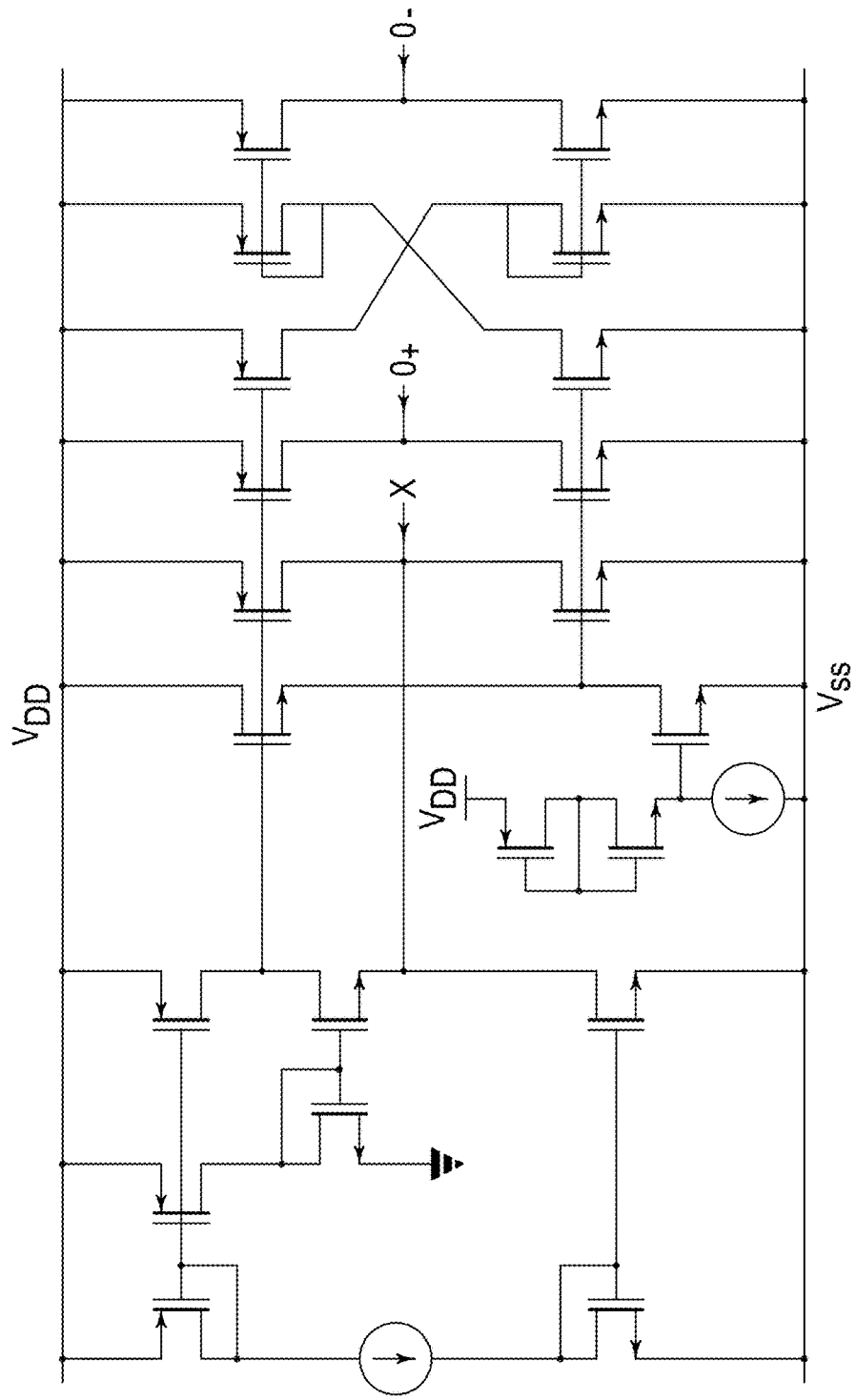
FIG. 3(a) shows a low power CMOS current amplifier (CA) with two complementary outputs for implementing the disclosed channel select filter.
Figure 3B:
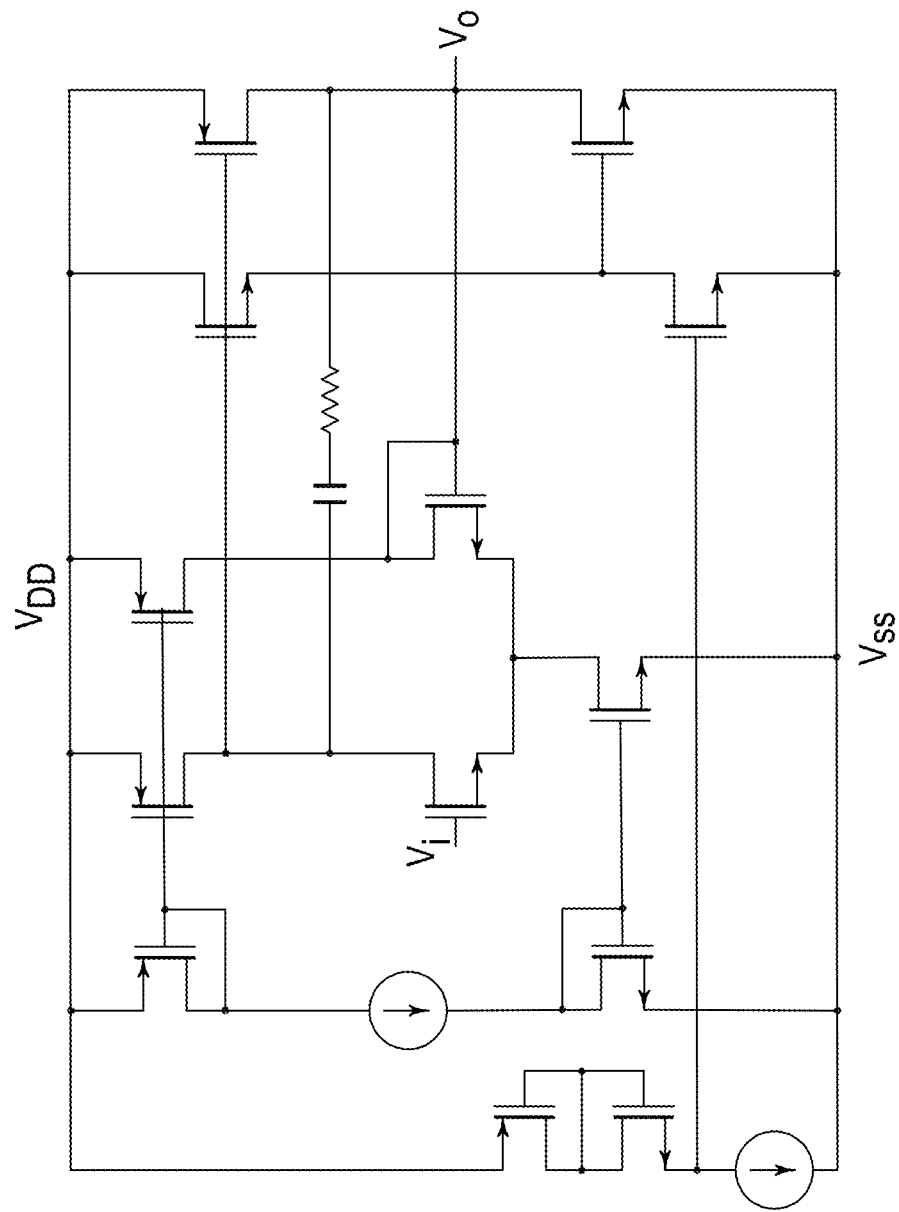
FIG. 3(b) shows a voltage buffer (VB) employing a class-AB output stage for implementing the disclosed channel select filter.

The core circuits for realizing the FDTRA (70) are shown in FIGS. 3(a) and 3(b). A low power CMOS current amplifier (CA) with two complementary outputs ($O_+$ and $O_-$) is shown in FIG. 3(a). The input stage transistors provide a DC virtual ground, as described in H. Alzaher, H. Elwan, and M. Ismail, "A CMOS highly linear channel-select filter for 3G multistandard integrated wireless receivers," *IEEE J. Solid-State Circuits*, vol. 37, no. 1, pp. 27-37, January 2002— incorporated herein by reference. The class-AB output stage is formed by a level shifter, a gain stage, and standby biasing transistors. The negative feedback of the CA of FIG. 3(a) reduces the input resistance.

However, the present disclosure is not limited to the CMOS architecture of the current amplifier (CA) shown in FIG. 3(a). Alternative CMOS and other architectures are known and can be used to implement the current amplifier (CA).

Figure 4:
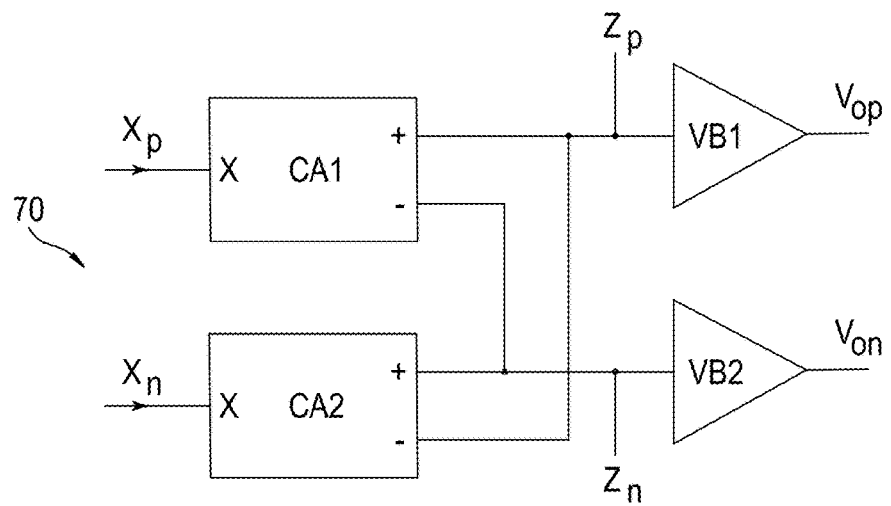
FIG. 4 shows a combination of the current amplifiers and voltage buffers to implement the FDTRA.

A voltage buffer (VB) employing a class-AB output stage is shown in FIG. 3(b). The VB utilizes a differential amplifier as an input stage to avoid body effect and DC voltage offset, as described in the above-cited system of H. Alzaher, H. Elwan, et al. FIG. 4 shows a combination of the core circuits of FIGS. 3(a) and 3(b) to implement the FDTRA (70). Specifically, the FDTRA (70) includes two of the CA's shown in FIG. 3(a), as CA1 and CA2, and two of the VB's of FIG. 3(b), as VB1 and VB2.

However, the present disclosure is not limited to the CMOS architecture of the voltage buffer (VB) shown in FIG. 3(b). Alternative CMOS and other architectures are known and can be used to implement the voltage buffer (VB).

The differential signals are obtained by subtracting the currents of the CAs at their output terminals. That is, the positive output terminal $O_+$ of CA1 is connected to the negative output terminal $I_-$ of CA2, as well as being connected to one of the differential impedance terminals $Z_p$ and to the input of VB1. Similarly, the negative output terminal $O_-$ of CA1 is connected to the positive output terminal $O_+$ of CA2, as well as being connected to the other one of the differential impedance terminals $Z_n$ and to the input of VB2. The outputs of VB1 and VB2 correspond to the outputs $V_{op}$ and $V_{on}$ of the FDTRA (70) and the single cascading section (40A) of the channel select filter (40).

In one embodiment, the channel select filter (40) is formed by cascading three sections of the filter shown in FIG. 2. The FDTRA incorporates CA1 and CA2 providing a differential current gain of 1. The passive components that realize the desired Chebyshev response with gain of 18 dB are calculated to be $C_1=2.66$ pF; $C_2=0.46$ pF; $R_1=R_3=86$ k$\Omega$; $R_2=2R_1$ for the first of the three sections; $C_1=3.63$ pF; $C_2=0.09$ pF; $R_1=R_3=86$ k$\Omega$; $R_2=2R_1$ for the second of the three sections; and $C_1=9.93$ pF; $C_2=0.02$ pF; $R_1=R_3=86$ k$\Omega$; $R_2=2R_1$ for the third of the three sections.

Simulation results of the above-described embodiment showed that the attenuation at 5.12 MHz is found to be around 27 dB, which satisfies the blocker attenuation requirement of the DVB-H standard. However, the passive values of the two capacitors for the second and third sections of the above-described embodiment are extremely small and may be difficult to fabricate. Therefore, a second embodiment includes an FDTRA incorporating CA1 and CA2 providing a differential current gain of K. The current gain K is obtained using proper sizing of the transistors forming the output stages.

The second embodiment including an FDTRA incorporating CA1 and CA2 with differential current gain of K has the following transfer function:

$$\frac{V_{op}-V_{on}}{V_{ip}-V_{in}} = \frac{K/(C_1C_2R_1R_3)}{s^2+s(R_1R_2+R_2R_3+R_1R_3)/(C_2R_1R_2R_3)+K/(C_1C_2R_2R_3)} \quad (2)$$

The transfer function of Equation (2) suggests that the current gain factor K can be utilized for increasing the value of passive capacitors. A current gain of K=25 is selected for the second and the third of the three sections of the filter, allowing much less variation between $C_1$ and $C_2$ values, while K=1 is selected for the first of the three sections. The design values of this second embodiment are $C_1=2.66$ pF; $C_2=0.46$ pF; $R_1=R_3=86$ k$\Omega$; $R_2=2R_1$ for the first of the three sections; $C_1=3.63$ pF; $C_2=2.25$ pF; $R_1=R_3=86$ k$\Omega$; $R_2=2R_1$ for the second of the three sections, and $C_1=9.93$ pF; $C_2=0.5$ pF; $R_1=R_3=86$ k$\Omega$; $R_2=2R_1$ for the third of the three sections.

Post layout simulations showed improved accuracy due to the use of larger capacitors in the second embodiment whose transfer function is shown by Equation (2). Since power consumption is an important design specification in portable devices, capacitor-banks are preferred over programmable devices. The above-described embodiments may be implemented through the use of capacitor matrices of 6-bits to allow tuning of ±20% around the nominal pole frequency.

In using the capacitor matrices, the value of a permanently connected capacitor C is selected based on maximum desired pole frequency. The capacitor matrix allows change in capacitor value from C to C+63$C_M$ in steps of $C_M$. A digital automatic frequency-tuning scheme can be employed, as described in H. Khorramabadi, M. Tarsia, and N. Woo, "Baseband filters for IS-95 CDMA receiver applications featuring digital automatic frequency tuning," in *IEEE Int. Solid-State Circuits Conf. (ISSCC) Dig. Tech. Papers*, February 1996, pp. 172-173—incorporated herein by reference.

Figure 5:
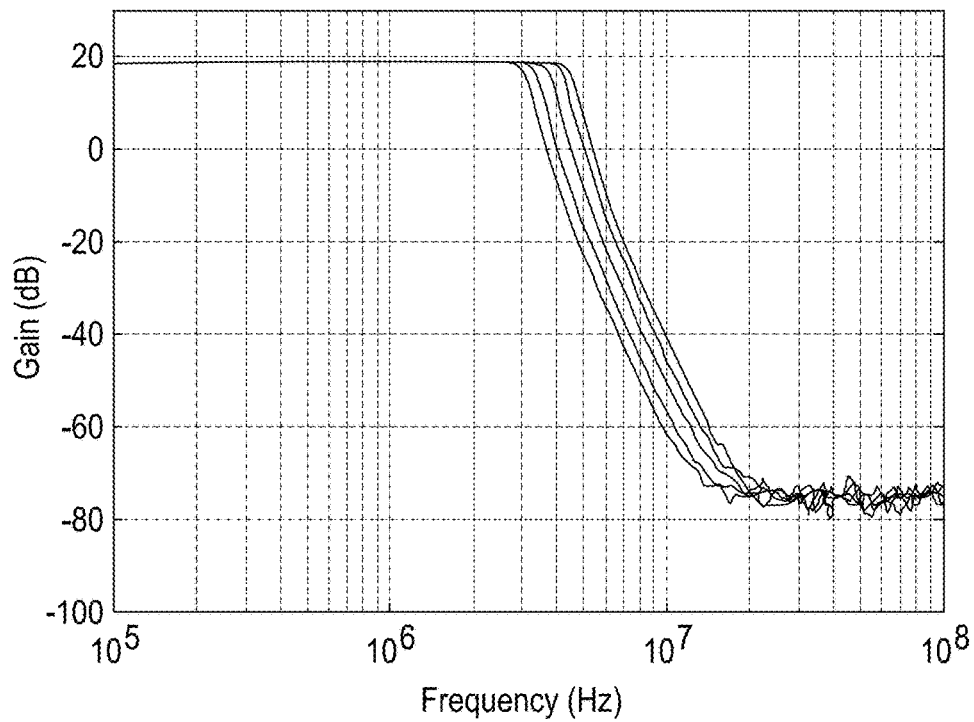
FIG. 5 shows measured results of an experimental assessment of a second embodiment showing the filter response tuned around a nominal frequency.

In an experimental assessment of the second embodiment described above as including an FDTRA incorporating CA1 and CA2 having differential current gain K, CA1 and CA2 are biased using supply voltages of ±0.9V, a bias current ($I_B$) of 10 µA, and a standby current ($I_{SB}$) of 4 µA. The bias current of each VB ($I_B$) is set to 10 µA, and their standby current ($I_{SB}$) is set to 4 µA. This leads to a total power consumption of approximately 1.5 mA. The measured results of the experimental assessment of the second embodiment showing the filter response tuned around the nominal frequency are shown in FIG. 5.

The attenuations at 5.12 MHz and 13.25 MHz blockers are found to be 28.5 dB and 82 dB, respectively. More of the measured characteristics of the second embodiment described above as including an FDTRA incorporating CA1 and CA2 having a differential current gain K are given in the last column of Table I below, together with characteristics of other known solutions for comparison. The top row refers to documents, cited above, that describe the respective known solutions. The in-band third-order input intercept point (IIP3) is determined by performing several intermodulation distortion (IM3) tests. The results of this measurement are obtained using two testing tones at 3.2 MHz and 3.5 MHz.

TABLE I

| | A. Tekin et al. | Y. Zhou et al. | C. Lujan-Martinez et al. | L. Chen et al. | Y. Wang et al. | M. Notten et al. | Present Application |
|---|---|---|---|---|---|---|---|
| Filter order | $6^{th}$ | $7^{th}$ | $6^{th}$ | $8^{th}$ | $8^{th}$ | $5^{th}$ | $6^{th}$ |
| Filter type | Cascade | Chebyshev | Chebyshev | Chebyshev | Butterworth | Elliptic | Chebyshev |
| Technique | FDNR-RC | Active-RC | $g_m$-C | Active-RC | Active-RC | Active-RC | FDTRA-RC |
| Amplifiers | 5 | 7 | 12 | 8 | 10 | 5 | 3 |
| Technology | 65 nm CMOS | BiCMOS | 0.5 µm CMOS | 65 nm CMOS | 65 nm CMOS | BiCMOS | 0.18 µm CMOS |
| Noise (nV/sqrt (Hz)) | 10 | 45 | Not reported | 11.4 | 87.24 | 46 | 51 |
| Inband IIP3 (dBm) | +15.5 | +23.16 | +33 | +12.4 | −18.2 | +23 | +33 |
| SFDR (dB) | 64.5 | 60.8 | — | 61.5 | 46.5 (0.2 MHz) 33.2 dB (20 MHz) | 60.5 | 66.7 |
| Supply (V) | 1.2 | 2.5 | 3.3 | 1.2 | 1.2 | 2.7 | 1.8 |
| Power (mW) | 6.6 | 56.0 | 79.2 | 11.0 | 1.72-9.6 | 14.0 | 1.50 |
| FOM (fJ) | 172 | 1861 | — | 289 | 5094 (0.2 MHz) 1313 (20 MHz) | 661 | 30 |

Table I shows that the filter of the present application is significantly more power efficient compared to the other solutions, due to the use of one active component per biquad and the TRA amplifier type. It also exhibits better spurious-free dynamic range (SFDR) than the comparative examples. Additionally, the characteristics of the filters are compared by evaluating their figure-of-merit defined as FOM=(Power)(Poles)$^{-1}$(Bandwidth)$^{-1}$(SFDR)$^{-1}$. Clearly, the FOM of the filter described in the present application is far more favorable than other solutions mainly due to its low power consumption.

Thus, the foregoing discussion discloses and describes merely exemplary embodiments of the present invention. As will be understood by those skilled in the art, the present invention may be embodied in other specific forms without departing from the spirit or essential characteristics thereof. Accordingly, the disclosure of the present invention is intended to be illustrative, but not limiting of the scope of the invention, as well as other claims. The disclosure, including any readily discernible variants of the teachings herein, define, in part, the scope of the foregoing claim terminology such that no inventive subject matter is dedicated to the public.

The invention claimed is:

1. A channel select filter comprising:
a fully differential transresistance amplifier (FDTRA) configured to change an input current at each differential input terminal to a voltage at each differential output terminal based on an impedance at a corresponding differential impedance terminal;
two first resistors, each having one end connected to a respective differential input terminal of the FDTRA and having another end connected to a node;
two feedback resistors, each having one end connected to a respective differential output terminal of the FDTRA and having another end connected to the node;
two first capacitors, each connected between ground and the node; and
two second capacitors, each connected between ground and a respective differential impedance terminal.

2. The channel select filter of claim 1, wherein the channel select filter is included in a Digital Video Broadcasting—Handheld (DVB-H) or a multi-standard mobile receiver.

3. The channel select filter of claim 1, wherein the FDTRA includes two current amplifiers, each including one of the differential input terminals, and two voltage buffers, each including one of the differential output terminals.

4. The channel select filter of claim 1, further comprising three cascading sections, each section including exactly one FDTRA, two feedback resistors, first resistors, first capacitors, and second capacitors.

5. The channel select filter of claim 4, wherein the second and third cascading sections have an FDTRA incorporating current amplifiers having a differential current gain of 25.

6. The channel select filter of claim 5, wherein the first cascading section has an FDTRA incorporating current amplifiers having a differential current gain of 1.

7. The channel select filter of claim 1, further comprising two second resistors, each connected in series with a respective one of the feedback resistors and in series with a respective one of the first resistors.

8. The channel select filter of claim 7, wherein each of the two first capacitors is connected between ground and a point between each respective pair of a first resistor and a second resistor.

9. A video receiver comprising:
a channel select filter including three cascading sections, each section including
exactly one fully differential transresistance amplifier (FDTRA) configured to change an input current at each differential input terminal to a voltage at each differential output terminal based on an impedance at a corresponding differential impedance terminal;
two first resistors, each having one end connected to a respective differential input terminal of the FDTRA and having another end connected to a node;
two feedback resistors, each having one end connected to a respective differential output terminal of the FDTRA and having another end connected to the node;
two first capacitors, each connected between ground and the node; and
two second capacitors, each connected between ground and a respective differential impedance terminal, wherein
a first cascading section has a current gain different from a current gain of a second cascading section and different from a current gain of a third cascading section.

10. The video receiver of claim 9, wherein the FDTRA includes two current amplifiers, each including one of the differential input terminals, and two voltage buffers, each including one of the differential output terminals.

11. The video receiver of claim 9, wherein the FDTRA of each of the second and third cascading sections incorporates current amplifiers having a differential current gain of 25.

12. The video receiver of claim 9, wherein the FDTRA of the first cascading section incorporates current amplifiers having a differential current gain of 1.

* * * * *